(12) United States Patent
Kawaguchi et al.

(10) Patent No.: US 12,221,693 B2
(45) Date of Patent: Feb. 11, 2025

(54) STRESS REDUCING METHOD

(71) Applicant: TOKYO ELECTRON LIMITED, Tokyo (JP)

(72) Inventors: Takuya Kawaguchi, Yamanashi (JP); Takanobu Hotta, Yamanashi (JP); Hideaki Yamasaki, Yamanashi (JP)

(73) Assignee: Tokyo Electron Limited, Tokyo (JP)

( * ) Notice: Subject to any disclaimer, the term of this patent is extended or adjusted under 35 U.S.C. 154(b) by 134 days.

(21) Appl. No.: 18/096,217

(22) Filed: Jan. 12, 2023

(65) Prior Publication Data
US 2023/0227969 A1  Jul. 20, 2023

(30) Foreign Application Priority Data
Jan. 19, 2022  (JP) ................ 2022-006197

(51) Int. Cl.
*C23C 16/44*  (2006.01)
*C23C 16/06*  (2006.01)
*C23C 16/34*  (2006.01)

(52) U.S. Cl.
CPC .......... *C23C 16/4404* (2013.01); *C23C 16/06* (2013.01); *C23C 16/34* (2013.01)

(58) Field of Classification Search
CPC ................................. C23C 16/4404
See application file for complete search history.

(56) References Cited

U.S. PATENT DOCUMENTS

| | | | | |
|---|---|---|---|---|
| 2004/0161883 A1* | 8/2004 | Colombo | .......... | H01L 21/02255 257/E21.01 |
| 2016/0379879 A1* | 12/2016 | Hotta | ................ | C23C 16/45527 438/656 |
| 2017/0110375 A1* | 4/2017 | Bao | ................. | H01L 21/823821 |

FOREIGN PATENT DOCUMENTS

| | | |
|---|---|---|
| JP | H11-307480 A | 11/1999 |
| WO | WO 2015/080058 A1 | 6/2015 |

* cited by examiner

*Primary Examiner* — Robert A Vetere
(74) *Attorney, Agent, or Firm* — Fenwick & West LLP

(57) ABSTRACT

There is provided a stress reducing method comprising: preparing a film forming apparatus configured to form a tungsten film on a substrate in a chamber by supplying a tungsten raw material gas and a reducing gas into the chamber; and making at least a part of a tungsten film deposited on an in-chamber component into a chlorine-containing tungsten film whose film stress is reduced by adjusting a chlorine concentration, when performing pre-coating in the chamber and/or when forming the tungsten film on the substrate, using the tungsten raw material gas and the reducing gas.

8 Claims, 9 Drawing Sheets

FIG.4
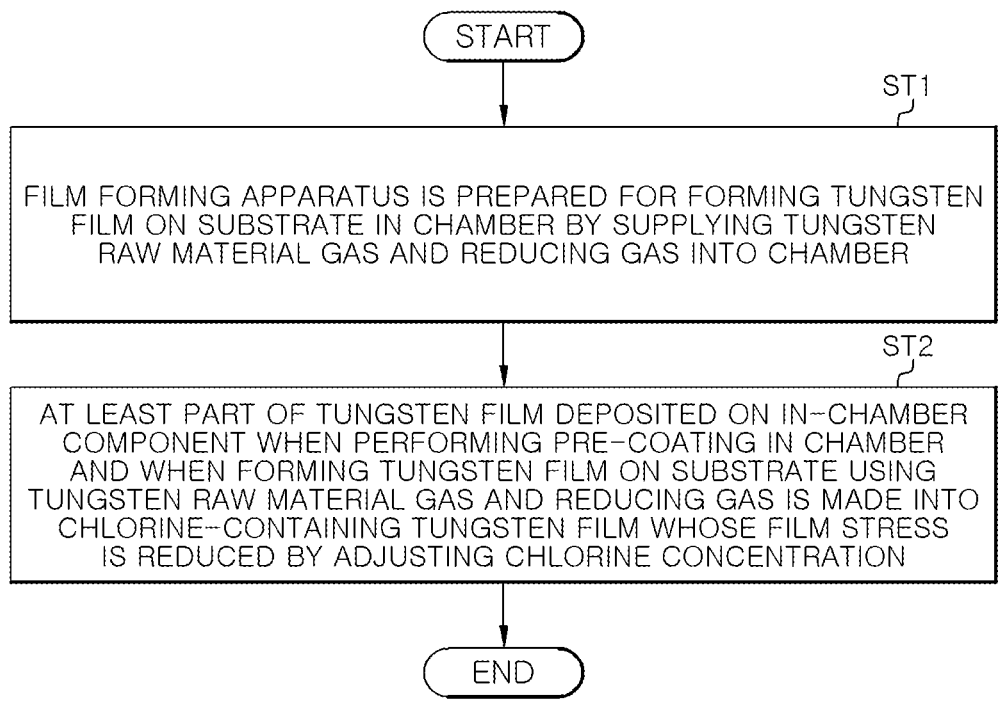
FIG.5A  FIG.5B  FIG.5C
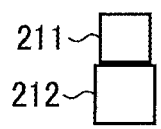
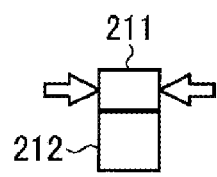
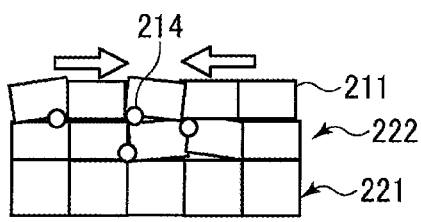

FIG.6A  FIG.6B  FIG.6C
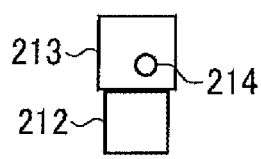
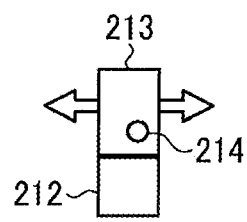
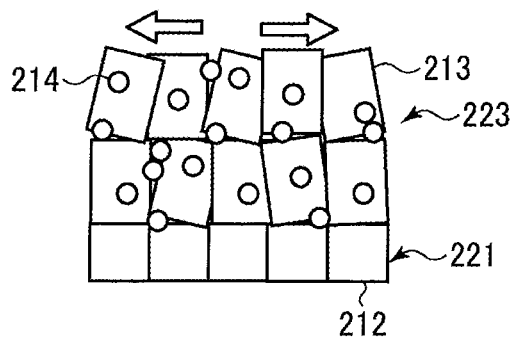
FIG.7A
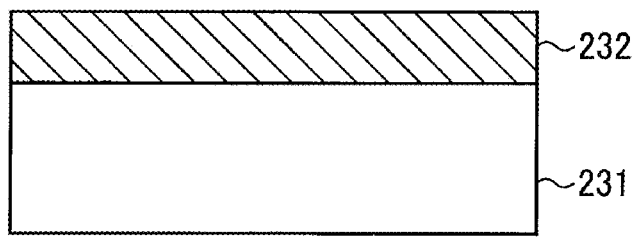
FIG.7B
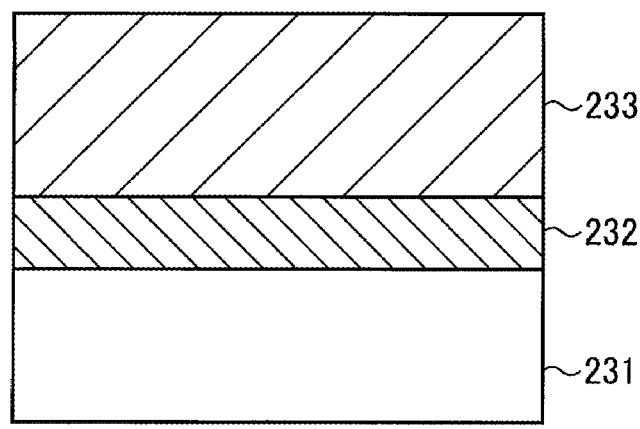

STRESS REDUCING METHOD

CROSS-REFERENCE TO RELATED APPLICATIONS

This application claims priority to Japanese Patent Application No. 2022-006197 filed on Jan. 19, 2022, the entire contents of which are incorporated herein by reference.

TECHNICAL FIELD

The present disclosure relates to a stress reducing method.

BACKGROUND

In a semiconductor manufacturing process, tungsten is used as a material for filling a contact hole formed on a substrate (semiconductor wafer) or a via hole between wirings and as a material for an interdiffusion barrier.

As a method for forming a tungsten film, a method for forming a film by a CVD method using a raw material gas, for example, tungsten hexafluoride ($WF_6$) and a reducing gas is known (for example, Patent Document 1). Further, in recent years, since design rules have become more and more detailed and there is concern about adverse effects on devices due to raw materials containing fluorine, a technique for forming a tungsten film by a CVD method or an ALD method using tungsten chloride as a raw material gas has also been proposed (for example, Patent Document 2).

Patent Document 1 described above discloses that in the case of forming a blanket tungsten film using $WF_6$, a tensile stress of the film increases when temperature of a substrate drops to a low temperature of about 400° C., causing the substrate to warp. In Ir the case of forming a tungsten film by a CVD method or an ALD method, since the tungsten film is also formed on inner walls of a chamber in which the film is formed or on a component inside the chamber (for example, a substrate stage) during pre-coating or film formation, it is feared that the same problem will also occur. Patent Document 1 discloses that the tensile stress of the film is eliminated by performing pre-processing with a mixed gas in which $WF_6$ and monosilane are mixed at a predetermined ratio.

PRIOR ART DOCUMENTS

Patent Documents

Patent Document 1: Japanese Laid-open Patent Publication No. H11-307480
Patent Document 2: International Publication No. WO 2015/080058

SUMMARY

The present disclosure provides a stress reducing method that can easily reduce a tensile stress of a tungsten film deposited on an in-chamber component in the case of forming the tungsten film on a substrate using a tungsten raw material gas and a reducing gas.

In accordance with an aspect of the present disclosure, there is provided a stress reducing method comprising: preparing a film forming apparatus configured to form a tungsten film on a substrate in a chamber by supplying a tungsten raw material gas and a reducing gas into the chamber; and making at least a part of a tungsten film deposited on an in-chamber component into a chlorine-containing tungsten film whose film stress is reduced by adjusting a chlorine concentration, when performing pre-coating in the chamber and/or when forming the tungsten film on the substrate, using the tungsten raw material gas and the reducing gas.

BRIEF DESCRIPTION OF THE DRAWINGS

The objects and features of the present disclosure will become apparent from the following description of embodiments, given in conjunction with the accompanying drawings, in which:

FIG. 4 is a flowchart showing a stress reducing method according to one embodiment:

FIGS. 5A to 5C are diagrams showing a model for explaining mechanism by which a tungsten film has a tensile stress:

FIGS. 6A to 6C are diagrams showing a model for explaining mechanism by which the tensile stress of the tungsten film containing a large amount of chlorine of 4 at % or more is reduced:

FIGS. 7A and 7B are cross-sectional views for explaining the stress reducing method according to one embodiment:

DETAILED DESCRIPTION

Hereinafter, embodiments will be described with reference to the accompanying drawings.

Overview

Figure 1:
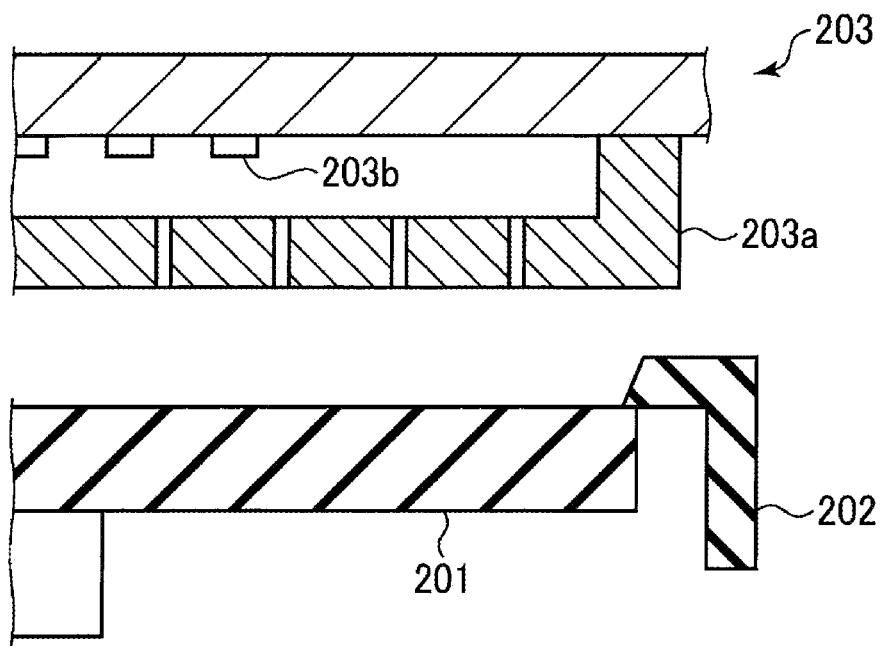
FIG. 1 is a cross-sectional view showing an example of an in-chamber component of a film forming apparatus.

In the case of forming a tungsten film on a substrate by a CVD method or an ALD method, a chamber of a film forming apparatus is pre-coated, then the substrate is loaded into the chamber and the tungsten film is actually formed on the substrate. Inside the chamber, as shown in FIG. 1, there are components such as a substrate stage (susceptor) 201, an outer ring 202, and a shower head 203, for example. The shower head 203 has a shower plate 203*a* and distribution blocks 203*b*. During the pre-coating or the actual film formation, a tungsten film is deposited on walls inside the chamber or on these components, that is, on in-chamber components.

A tungsten film generally has a tensile stress. The tensile stress of the tungsten film shows a high value according to a film thickness. Therefore, if a tungsten film is deposited on the in-chamber components when the tungsten film is pre-coated or actually formed on the substrate, inconvenience described below will occur.

Figure 2:
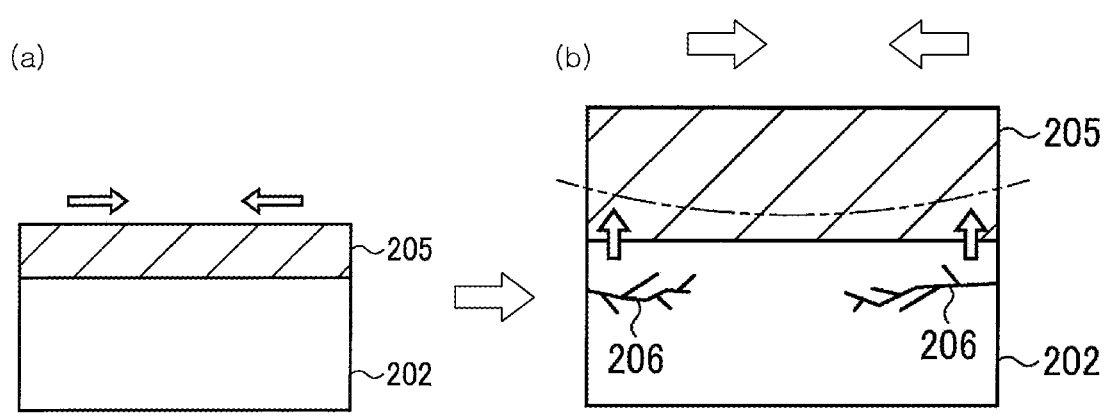
FIG. 2 is a cross-sectional view schematically showing a state in which cracks are generated in a substrate stage due to a tensile stress of a tungsten film deposited during pre-coating or actual film formation, in the case where the in-chamber component is the substrate stage made of ceramics.
Figure 3:
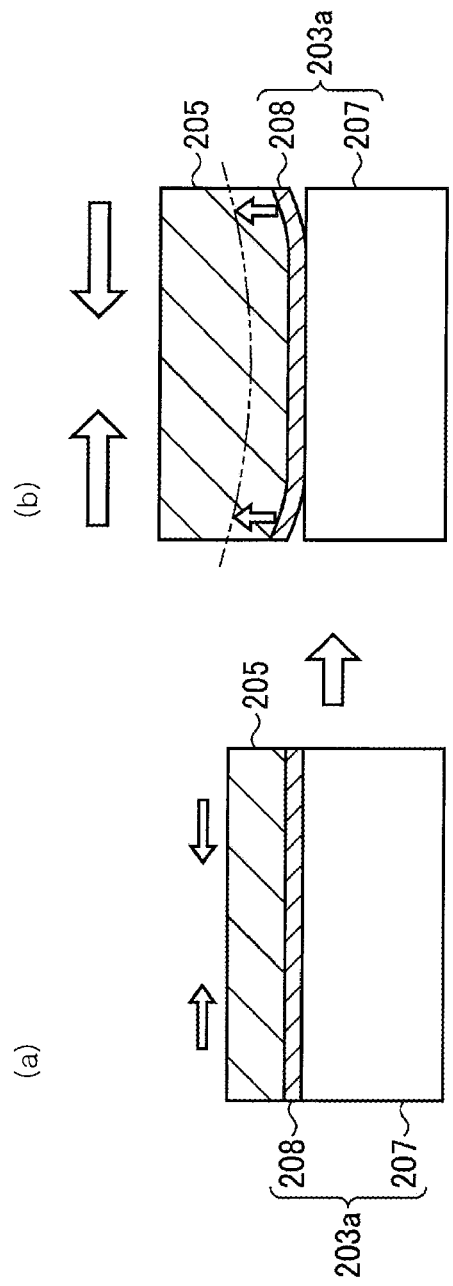
FIG. 3 is a cross-sectional view schematically showing a state in which a coating film is peeled off due to a tensile stress of a tungsten film deposited during pre-coating or actual film formation, in the case where the in-chamber component is a shower plate in which the coating film is formed on a metal base.

For example, as shown in (a) of FIG. 2, in the case where the in-chamber component is the substrate stage (susceptor) 202 made of ceramics such as AlN or the like, during pre-coating or actual film formation on the substrate, when the tungsten film 205 is deposited on the in-chamber component, a tensile stress in the arrow directions is generated. As shown in (b) of FIG. 2, when the tungsten film 205 becomes thicker, the tensile stress increases and cracks 206 may be generated in the substrate stage 202. Further, as shown in (a) of FIG. 3, in the case where the in-chamber component is a shower plate 203*a* in which a coating film 208 such as ceramics is formed on a metal base 207 such as aluminum, if the tungsten film 205 is deposited on the in-chamber component, a tensile stress is similarly generated. As shown in (b) of FIG. 3, when the tungsten film 205 becomes thicker, the tensile stress similarly increases, and the coating film 208 may peel off.

Therefore, in one embodiment, the stress of the tungsten film deposited on the in-chamber component is reduced when the pre-coating is performed in the chamber or the tungsten film is formed on the substrate. Specifically, a stress adjusting method having steps ST1 and ST2 shown in FIG. 4 is provided. In step ST1, the film forming apparatus is prepared for supplying a tungsten raw material gas and a reducing gas into the chamber to form the tungsten film on the substrate in the chamber. In step ST2, at least a part of the tungsten film deposited on the in-chamber component when the pre-coating is performed in the chamber or when the tungsten film is formed on the substrate using the tungsten raw material gas and the reducing gas is made into a chlorine-containing tungsten film whose film stress is reduced by adjusting a chlorine concentration. By adjusting the chlorine concentration of the deposited tungsten film, the tensile stress of the tungsten film deposited on the in-chamber component can be easily reduced.

For example, in the case of forming a tungsten film by a CVD method or an ALD method using a tungsten chloride gas and a reducing gas, the chlorine concentration in the film is generally about 2 at % or less, and the same applies to the tungsten film deposited on the in-chamber component. The tensile stress of the tungsten film at this time is a high value of 1700 to 1900 MPa when the film thickness is about 50 to 100 nm. On the other hand, increasing the chlorine concentration in the film can reduce the tensile stress. By setting the chlorine concentration to 4 at % or higher, the tensile stress can be set to 500 MPa or lower, and the stress of the film can be set to a compressive stress.

Generally, a mechanism by which a deposited tungsten film has a tensile stress can be explained by the model shown in FIGS. 5A to 5C. As shown in FIG. 5A, when the size of a crystal lattice 211 of a tungsten crystal is smaller than the size of a crystal lattice 212 of a crystal of a base (for example, substrate stage), as shown in FIG. 5B, the crystal lattice 211 of the tungsten is dragged by the crystal lattice 212 of the base and has a tensile stress. Therefore, as shown in FIG. 5C, for example, a tungsten film 222 deposited on a substrate stage 221 has a tensile stress as a whole. Such a tendency does not change even when the film contains about 2 at % of chlorine as an impurity.

On the other hand, a mechanism by which the tensile stress of the tungsten film containing a large amount of chlorine (for example, 4 at % or more) decreases and further becomes a compressive stress can be explained by a model shown in FIGS. 6A to 6C, for example. A crystal lattice 213 of a high-chlorine containing tungsten crystal containing a large amount of chlorine 214 is larger than the ordinary crystal lattice 211. Therefore, the crystal lattice 213 approaches the size of the crystal lattice 212 of the base (for example, the substrate stage), and in some cases, as shown in FIG. 6A, the size of the crystal lattice 213 of the tungsten crystal is larger than the size of the crystal lattice 212 of the crystal of the base. The tensile stress is relieved when the size of the crystal lattice 213 of the tungsten crystal approaches the size of the crystal lattice 212 of the crystal of the base. Further, when the crystal lattice 213 of the tungsten crystal becomes larger as shown in FIG. 6A, the crystal lattice 213 of high-chlorine containing tungsten is dragged by the crystal lattice 212 of the base and has a compressive stress as shown in FIG. 6B. In this case, as shown in FIG. 6C, for example, a high chlorine concentration tungsten film 223 formed on the substrate stage 221, which is the base, has a compressive stress as a whole.

The in-chamber components, such as the walls inside the chamber, the substrate stage, and the shower head, are pre-coated with the tungsten film prior to forming the tungsten film on the substrate. In this case, the chlorine-containing tungsten film with the chlorine concentration adjusted as described above may be deposited from the beginning of the pre-coating, however, in the case of a tungsten film with a high chlorine concentration (for example, 4 at % or more), it may be difficult to deposit it on the surface of the in-chamber component by the general CVD method or ALD method during the pre-coating. For this reason, as shown in FIG. 7A, an initial tungsten film 232 with a low chlorine concentration and a tensile stress is deposited under normal conditions so that a chlorine-containing tungsten film with a high chlorine concentration can be deposited on, for example, the substrate stage 231 as the in-chamber component. Then, as shown in FIG. 7B, a chlorine-containing tungsten film 233 is deposited on the initial tungsten film 232. The film thickness of the initial tungsten film 232 is preferably 0.5 nm or more, more preferably in the range of 1 to 15 nm.

As described above, by depositing the tungsten film having a tensile stress under normal conditions and then depositing the chlorine-containing tungsten film, if the chlorine-containing tungsten film has a compressive stress, the stress of the tungsten film with the tensile stress can be relieved or offset. Further, even if the chlorine-containing tungsten film has a low tensile stress, the stress of the entire film can be relieved.

Next, an example of a method for reducing a stress by making at least a part of a tungsten film deposited on the in-chamber component as a chlorine-containing tungsten film with a high chlorine concentration in the case of forming a tungsten film by a CVD method or an ALD method using a tungsten chloride gas and a reducing gas will be described.

The normal conditions for forming a tungsten film using a tungsten chloride gas and a reducing gas include a substrate temperature of 400° C. or higher and a flow rate of $H_2$ gas supplied as a reducing gas of 1000 to 10000 sccm ($H_2$ gas partial pressure of 3.73 to 21.36 Torr (497 to 2848 Pa)). The tensile stress of the tungsten film formed under these conditions shows a high value of 1700 to 1900 MPa when the film thickness is about 50 to 100 nm. Further, the chlorine concentration of the tungsten film deposited under such conditions is as low as 2 at % or less. At this time, a tungsten film is also deposited on the in-chamber component, and a large tensile stress is similarly generated in the tungsten film thus deposited. Also, when the inside of the chamber is pre-coated without loading the substrate into the chamber, a tungsten film with a low chlorine concentration and a large tensile stress is similarly deposited on the in-chamber component.

On the other hand, by lowering the substrate temperature or reducing the $H_2$ gas flow rate (reducing the $H_2$ gas partial pressure), the chlorine concentration in the tungsten film can be adjusted to increase, and the stress in the deposited tungsten film can be reduced. Specifically, by setting the substrate temperature to 380° C. or lower or the $H_2$ gas flow rate to 800 sccm ($H_2$ gas partial pressure of 3.03 Torr (404 Pa)) or lower, the chlorine concentration is made higher than that in the tungsten film under normal conditions, and the tensile stress of the film can be reduced. When the substrate temperature is 380° C. or lower, or the $H_2$ gas flow rate ($H_2$ gas partial pressure) is 800 sccm or less ($H_2$ gas partial pressure is 3.03 Torr (404 Pa) or less), the chlorine concentration in the film can be 4 at % or more. Furthermore, when the $H_2$ gas flow rate ($H_2$ gas partial pressure) is 500 sccm or less ($H_2$ gas partial pressure is 1.95 Torr (259 Pa) or less), it is more preferable because the tensile stress of the film can be set to 500 MPa or less, or the film stress can be set to a compressive stress. Both lowering the substrate temperature and reducing the $H_2$ gas flow rate may be performed to increase the chlorine concentration in the tungsten film.

In order to deposit such a chlorine-containing tungsten film with a high chlorine concentration on at least a part of the in-chamber component, only the pre-coating may be performed under the above conditions, only the actual film formation may be performed under the above conditions, or both the pre-coating and the actual film formation may be performed under the above conditions. When the actual film formation is performed under the above-described low temperature and low hydrogen partial pressure conditions, a chlorine-containing tungsten film is also formed on the substrate, and the tensile stress of the tungsten film formed on the substrate can be reduced. However, it is difficult to form a tungsten film with a high chlorine concentration on a silicon wafer or a TiN film as a base film during the actual film formation. Therefore, in the actual film formation, it is preferable to form an initial tungsten film with a low chlorine concentration on a silicon wafer or a TiN film under normal conditions, and then form a chlorine-containing tungsten film.

In Patent Document 1, it is disclosed that in the case of forming a tungsten film by a CVD method using $WF_6$ and a reducing gas, since the tensile stress increases when the substrate temperature drops to a low temperature of about 400° C., pretreatment is performed with a mixed gas in which $WF_6$ and monosilane are mixed at a predetermined ratio to reduce the tensile stress. The method of Patent Document 1 can also reduce the tensile stress of the tungsten film deposited on the in-chamber component. However, the method of Patent Document 1 requires complicated processes, and there is concern that the fluorine contained in $WF_6$ may adversely affect the device, so a different approach is required.

In the present embodiment, at least a part of the tungsten film deposited on the in-chamber component when performing pre-coating in the chamber or forming the tungsten film on the substrate is a chlorine-containing tungsten film whose film stress is reduced by the chlorine concentration in the film. Accordingly, the tensile stress of the tungsten film deposited on the in-chamber component can be easily reduced. In particular, since a tungsten film with a chlorine concentration of 4 at % or more has a tensile stress of 500 MPa or less and the stress of the film can become a compressive stress, the effect of reducing the stress of the entire tungsten film deposited on the in-chamber component is large.

Specific Embodiment

Next, a specific embodiment for reducing a stress of a tungsten film deposited on an in-chamber component in a film forming apparatus for forming a tungsten film by an ALD method will be described.

Example of Film Forming Apparatus

Figure 8:
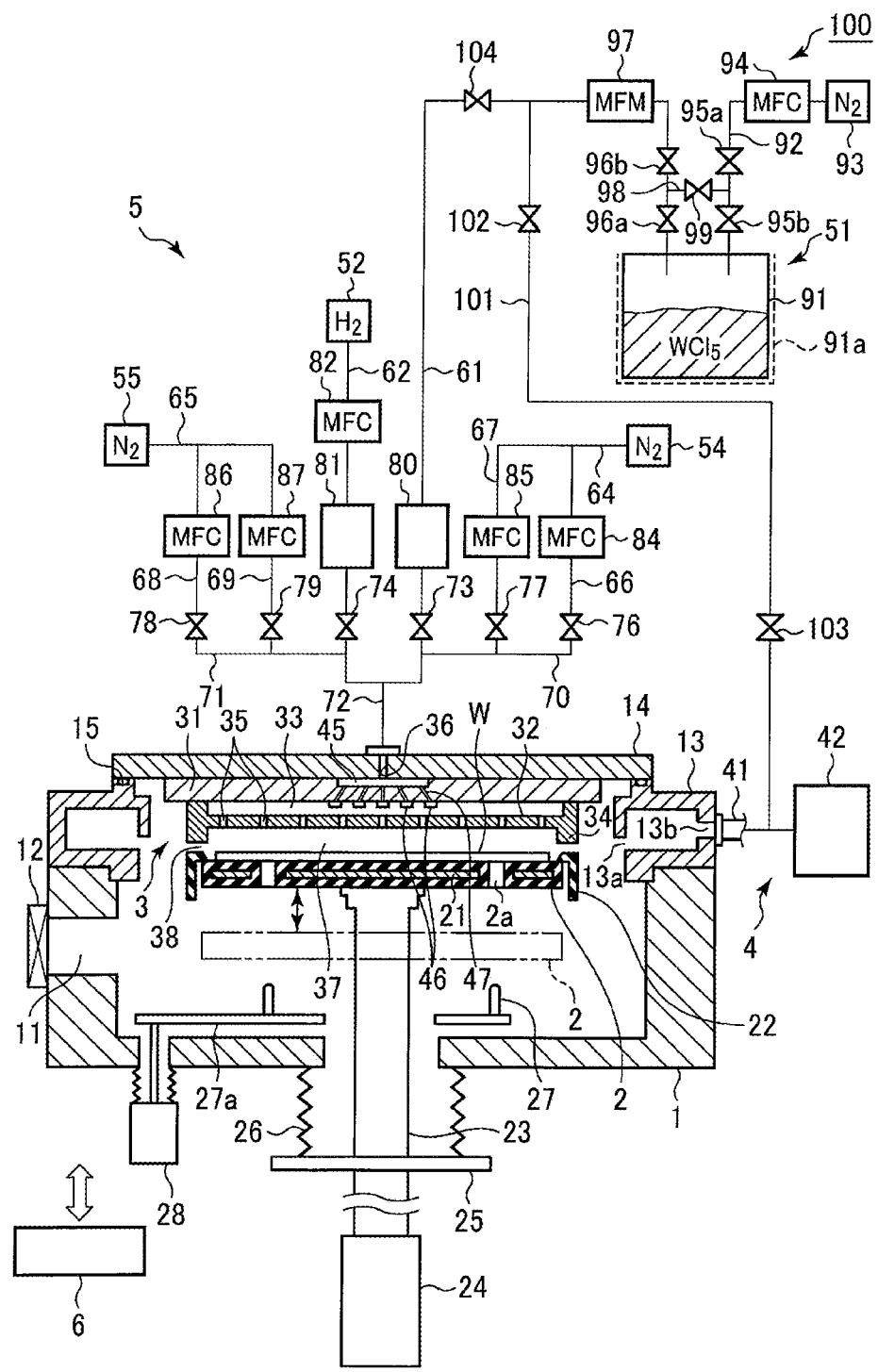
FIG. 8 is a cross-sectional view showing an example of a film forming apparatus used for forming a tungsten film.

FIG. 8 is a cross-sectional view showing an example of a film forming apparatus used when forming a tungsten film by an ALD method.

A film forming apparatus 100 includes a chamber 1, a susceptor 2 as a substrate stage for horizontally supporting a semiconductor wafer (hereinafter, simply referred to as a "wafer") W as a substrate within the chamber 1, a shower head 3 for supplying a processing gas into the chamber 1 in the form of a shower, an exhaust device 4 for exhausting the inside of the chamber 1, a processing gas supply mechanism 5 for supplying the processing gas to the shower head 3, and a controller 6.

The chamber 1 is made of metal such as aluminum or the like and has a substantially cylindrical shape. A loading/unloading port 11 for loading/unloading the wafer W is formed on the sidewall of the chamber 1, and the loading/unloading port 11 can be opened and closed by a gate valve 12. An annular exhaust duct 13 having a rectangular cross section is provided on the main body of the chamber 1. A slit 13a is formed along the inner peripheral surface of the exhaust duct 13. An exhaust port 13b is formed on the outer wall of the exhaust duct 13. A ceiling wall 14 is provided on the upper surface of the exhaust duct 13 so as to block the upper opening of the chamber 1. A space between the ceiling wall 14 and the exhaust duct 13 is airtightly sealed with a seal ring 15.

The susceptor 2 is disc-shaped and has a size corresponding to that of the wafer W, and is supported by a support member 23. The susceptor 2 is made of a ceramic material such as aluminum nitride (AlN) or a metal material such as aluminum or a nickel-based alloy, and a heater 21 for heating the wafer W is embedded therein. The heater 21 is powered by a heater power supply (not shown) to generate heat. By controlling the output of the heater 21 by a temperature signal from a thermocouple (not shown) provided near a wafer placing surface on the upper surface of the susceptor 2, the wafer W is controlled to a predetermined temperature.

The susceptor 2 is provided with an outer ring 22 made of ceramics such as alumina or the like so as to cover the outer peripheral region of the wafer placing surface and the side surface of the susceptor 2.

The support member 23 that supports the susceptor 2 extends downward from the chamber 1 through a hole formed in the bottom wall of the chamber 1 from the center of the bottom surface of the susceptor 2 and its lower end is connected to an elevating mechanism 24, so that the susceptor 2 can move up and down between a processing position shown in FIG. 8 and a transfer position at which the wafer can be transferred, which is located below the processing position and indicated by a dashed-dotted line, via the support member 23 by the elevating mechanism 24. Further, a flange portion 25 is attached to the lower portion of the support member 23 that is located below the chamber 1, and a bellows 26 is provided between the bottom surface of the chamber 1 and the flange portion 25 to separate the atmosphere in the chamber 1 from the outside air and expand and contract as the susceptor 2 moves up and down.

Three wafer support pins 27 (only two are shown) are provided near the bottom surface of the chamber 1 so as to protrude upward from an elevating plate 27a. The wafer support pins 27 can be moved up and down via the elevating plate 27a by an elevating mechanism 28 provided below the chamber 1, are inserted into through-holes 2a provided in the susceptor 2 at the transfer position, and can protrude from the upper surface of the susceptor 2. The wafer W is transferred between a wafer transfer mechanism (not shown) and the susceptor 2 by raising and lowering the wafer support pins 27 in this way.

The shower head 3 is made of metal, is provided so as to face the susceptor 2, and has approximately the same diameter as the susceptor 2. The shower head 3 has a main body 31 fixed to the ceiling wall 14 of the chamber 1 and a shower plate 32 connected to the bottom of the main body 31. A gas diffusion space 33 is formed between the main body 31 and the shower plate 32.

A plurality of distribution blocks 46 are provided in the gas diffusion space 33. A plurality of gas discharge holes are formed around the distribution blocks 46 and configured to distribute a gas. Each of the distribution blocks 46 is connected to one end of each of a plurality of gas supply paths 47 provided in the main body 31. The other end of each of the gas supply paths 47 is connected to a diffusion portion 45 formed in the central portion of the upper surface of the main body 31. Further, a gas introduction hole 36 penetrating from the upper surface of the ceiling wall 14 to the diffusion portion 45 is provided in the central portion of the ceiling wall 14.

An annular protrusion 34 protruding downward is formed at the peripheral edge of the shower plate 32, and gas discharge holes 35 are formed on the flat surface inside the annular protrusion 34 of the shower plate 32.

When the susceptor 2 is located at the processing position, a processing space 37 is formed between the shower plate 32 and the susceptor 2, and the annular protrusion 34 and the upper surface of the outer ring 22 of the susceptor 2 are adjacent to form an annular gap 38.

The exhaust device 4 includes an exhaust pipe 41 connected to the exhaust port 13b of the exhaust duct 13, and an exhaust mechanism 42 connected to the exhaust pipe 41 and having a vacuum pump, a pressure control valve (APC), or the like. During processing, the gas in the chamber 1 reaches the exhaust duct 13 through the slit 13a and is exhausted from the exhaust duct 13 through the exhaust pipe 41 by the exhaust mechanism 42 of the exhaust device 4.

The processing gas supply mechanism 5 includes a $WCl_5$ gas supply mechanism 51 for supplying $WCl_5$ gas as tungsten chloride which is a tungsten raw material gas, an $H_2$ gas supply source 52 for supplying $H_2$ gas as a reducing gas, and a first $N_2$ gas supply source 54 and a second $N_2$ gas supply source 55 for supplying $N_2$ gas which is a purge gas, and further includes a $WCl_5$ gas supply line 61 extending from the $WCl_5$ gas supply source 51, an $H_2$ gas supply line 62 extending from the $H_2$ gas supply source 52, a first $N_2$ gas supply line 64 extending from the first $N_2$ gas supply source 54 and supplying $N_2$ gas to the $WCl_5$ gas supply line 61 side, and a second $N_2$ gas supply line 65 extending from the second $N_2$ gas supply source 55 and supplying $N_2$ gas to the $H_2$ gas supply line 62 side. Tungsten chloride is not limited to $WCl_5$, and $WCl_4$ or $WCl_6$ may also be used.

The first $N_2$ gas supply line 64 branches into a first continuous $N_2$ gas supply line 66 that constantly supplies $N_2$ gas during film formation by an ALD method, and a first flash purge line 67 that supplies $N_2$ gas only during a purge process. The second $N_2$ gas supply line 65 branches into a second continuous $N_2$ gas supply line 68 that constantly supplies $N_2$ gas during film formation by an ALD method, and a second flash purge line 69 that supplies $N_2$ gas only during a purge process. The first continuous $N_2$ gas supply line 66 and the first flash purge line 67 are connected to a first connection line 70, and the first connection line 70 is connected to the $WCl_5$ gas supply line 61. The second continuous $N_2$ gas supply line 68 and the second flash purge line 69 are connected to a second connection line 71, and the second connection line 71 is connected to the $H_2$ gas supply line 62. The $WCl_5$ gas supply line 61 and the $H_2$ gas supply line 62 join to a joining pipe 72, and the joining pipe 72 is connected to the gas introduction hole 36 described above.

On/off valves 73, 74, 76, 77, 78, and 79 for switching gases during ALD are respectively provided on the most downstream side of the $WCl_5$ gas supply line 61, the $H_2$ gas supply line 62, the first continuous $N_2$ gas supply line 66, the first flash purge line 67, the second continuous $N_2$ gas supply line 68, and the second flash purge line 69. Further, mass flow controllers 82, 84, 85, 86, and 87 as flow rate controllers are respectively provided on the upstream side of the on/off valves of the $H_2$ gas supply line 62, the first continuous $N_2$ gas supply line 66, the first flash purge line 67, the second continuous $N_2$ gas supply line 68, and the second flash purge line 69. Further, the $WCl_5$ gas supply line 61 and the $H_2$ gas supply line 62 are provided with buffer tanks 80 and 81, respectively, so that necessary gas can be supplied in a short time.

The $WCl_5$ gas supply mechanism 51 has a film forming raw material tank 91 containing $WCl_5$. $WCl_5$ is solid at room temperature, and solid $WCl_5$ is stored in the film forming raw material tank 91. A heater 91a is provided around the film forming raw material tank 91 to heat the film forming raw material in the film forming raw material tank 91 to an appropriate temperature to sublime $WCl_5$. The $WCl_5$ gas supply line 61 described above is inserted into the film forming raw material tank 91 from above.

The $WCl_5$ gas supply mechanism 51 includes a carrier gas pipe 92 inserted from above into the film forming raw material tank 91, a carrier $N_2$ gas supply source 93 for supplying $N_2$ gas, which is a carrier gas, to the carrier gas pipe 92, a mass flow controller 94 as a flow rate controller and on/off valves 95a and 95b on the downstream side of the mass flow controller 94, which are connected to the carrier gas pipe 92, and on/off valves 96a and 96b and a mass flow meter 97 connected to the $WCl_5$ gas supply line 61 near the film forming raw material tank 91. On the carrier gas pipe 92, the on/off valve 95a is provided directly below the mass flow controller 94, and the on/off valve 95b is provided at the insertion end side of the carrier gas pipe 92. Further, the on/off valves 96a and 96b and the mass flow meter 97 are arranged in the order of the on/off valve 96a, the on/off valve 96b, and the mass flow meter 97 from the insertion end of the $WCl_5$ gas supply line 61.

A bypass pipe 98 is provided to connect a position between the on/off valve 95a and the on/off valve 95b of the carrier gas pipe 92 and a position between the on/off valve 96a and the on/off valve 96b of the $WCl_5$ gas supply line 61, and an on/off valve 99 is interposed in the bypass pipe 98. By closing the on/off valves 95b and 96a and opening the on/off valves 99, 95a, and 96b, $N_2$ gas from the carrier $N_2$ gas supply source 93 can be supplied to the $WCl_5$ gas supply line 61 through the carrier gas pipe 92 and the bypass pipe 98 to purge the $WCl_5$ gas supply line 61.

One end of an EVAC pipe 101 is connected to the downstream position of the mass flow meter 97 in the $WCl_5$ gas supply line 61, and the other end of the EVAC pipe 101 is connected to the exhaust pipe 41. On/off valves 102 and 103 are provided near the $WCl_5$ gas supply line 61 and near the exhaust pipe 41 of the EVAC pipe 101, respectively. Further, an on/off valve 104 is provided at the downstream side of the connection position of the EVAC pipe 101 in the $WCl_5$ gas supply line 61. By opening the on/off valves 102, 103, 96a, and 96b while the on/off valves 104, 99, 95a, and 95b are closed, the inside of the film forming raw material tank 91 can be evacuated by the exhaust mechanism 42.

The controller 6 is composed of a computer, and has a main controller having a CPU, an input device, an output device, a display device, and a storage device (storage medium). The main controller controls, for example, the opening and closing of the valves, the flow rate of gas by the flow rate controller, the opening degree of the pressure control valve (APC), the output of the heater that heats the wafer W, and the like.

Processing Operation

Next, the processing operation of the film forming apparatus shown in FIG. 8 will be described.

First, the pre-coating is performed in the chamber 1 without loading the wafer W, which is a substrate, into the chamber 1. Next, the wafer W, which is a substrate, is loaded into the chamber 1 through the loading/unloading port 11, and a tungsten film is formed on the wafer W.

In both the pre-coating and the actual film formation on the wafer W, prior to the processing, the susceptor 2 is heated to a predetermined temperature by the heater 21, the pressure in the chamber 1 is increased, and the temperature of the wafer W on the susceptor 2 is stabilized. After the inside of the chamber 1 reaches a predetermined pressure, the on/off valves 102 and 103 are closed and the on/off valves 104, 95a, and 95b are opened to increase the pressure in the film forming raw material tank 91 to make it possible to supply $WCl_5$ gas which is a tungsten raw material.

Both the pre-coating of the tungsten film and the actual film formation of the tungsten film on the wafer W are performed by supplying $WCl_5$ gas which is a film forming raw material gas, $H_2$ gas which is a reducing gas, and $N_2$ gas which is a purge gas sequentially in the following manner in the above state.

First, while the on/off valve 76 and the on/off valve 78 are kept open, $N_2$ gas is continuously supplied from the first $N_2$ gas supply source 54 and the second $N_2$ gas supply source 55 through the first continuous $N_2$ gas supply line 66 and the second continuous $N_2$ gas supply line 68, and by opening the on/off valve 73, $WCl_5$ gas is supplied from the $WCl_5$ gas supply mechanism 51 to the processing space 37 in the chamber 1 through the $WCl_5$ gas supply line 61. At this time, $WCl_5$ gas is supplied into the chamber 1 after being temporarily stored in the buffer tank 80. As a result, $WCl_5$ gas is adsorbed on the surface of the in-chamber component during the pre-coating. Further, during the actual film formation, $WCl_5$ gas is adsorbed on both the surface of the wafer W and the surface of the in-chamber component.

Next, while continuing to supply $N_2$ gas through the first continuous $N_2$ gas supply line 66 and the second continuous $N_2$ gas supply line 68, the on/off valve 73 is closed to stop the supply of $WCl_5$ gas and the on/off valves 77 and 79 are opened to supply $N_2$ gas (flash purge $N_2$ gas) from the first flash purge line 67 and the second flash purge line 69 as well, thereby purging excessive $WCl_5$ gas or the like in the processing space 37 with a large flow of $N_2$ gas.

Next, the on/off valves 77 and 79 are closed to stop the supply of $N_2$ gas from the first flash purge line 67 and the second flash purge line 69, and while continuing to supply $N_2$ gas through the first continuous $N_2$ gas supply line 66 and the second continuous $N_2$ gas supply line 68, the on/off valve 74 is opened to supply $H_2$ gas as a reducing gas from the $H_2$ gas supply source 52 to the processing space 37 through the $H_2$ gas supply line 62. At this time, $H_2$ gas is supplied into the chamber 1 after being temporarily stored in the buffer tank 81. As a result, $WCl_5$ gas adsorbed on the surface of the in-chamber component is reduced to tungsten during the pre-coating. During the actual film formation, $WCl_5$ gas adsorbed on both the surface of the wafer W and the surface of the in-chamber component is reduced.

Next, while continuing to supply $N_2$ gas through the first continuous $N_2$ gas supply line 66 and the second continuous $N_2$ gas supply line 68, the on/off valve 74 is closed to stop the supply of $H_2$ gas from the $H_2$ gas supply line 62, and the on/off valves 77 and 79 are opened to supply $N_2$ gas (flash purge $N_2$ gas) from the first flash purge line 67 and the second flash purge line 69 as well, thereby purging excessive $H_2$ gas in the processing space 37 with a large flow of $N_2$ gas.

A thin tungsten unit film is formed by performing one cycle of the above steps in a short time, and a tungsten film having a predetermined film thickness is obtained by repeating the cycle of these steps a plurality of times.

In the film forming apparatus 100, when performing the pre-coating and the actual film formation on the wafer W as described above, the tensile stress is reduced by adjusting chlorine concentration in the tungsten film deposited on the wall of the chamber 1 or the in-chamber component such as the susceptor (substrate stage).

The conditions in this case are as follows.
Pressure: 10 to 60 Torr (1333 to 7998 Pa)
Temperature: 400 to 600° C.
$WCl_5$ gas flow rate: 0.5 to 40 sccm
(Carrier gas flow rate: 100 to 5000 sccm)
$H_2$ gas flow rate: 1000 to 10000 sccm
($H_2$ gas partial pressure: 3.73 to 21.36 Torr (497 to 2848 Pa))
$N_2$ gas flow rate of continuous supply: 10 to 5000 sccm
$N_2$ gas flow rate of flash purge: 500 to 5000 sccm
Raw material tank temperature: 50 to 200° C.

However, with regard to the $H_2$ gas partial pressure, in the case of film formation by the ALD method, the $H_2$ gas partial pressure for the entire ALD cycle is given.

Under these conditions, the tungsten film deposited on the in-chamber component has a large tensile stress as described above.

On the other hand, when depositing a chlorine-containing tungsten film for stress adjustment, the chlorine concentration in the film is adjusted to increase by lowering the substrate temperature or reducing the $H_2$ gas flow rate with respect to the above normal conditions. Specifically, the chlorine concentration in the film is set to 4 at % or higher by setting the substrate temperature to 380° C. or lower, or by setting the $H_2$ gas flow rate to 800 sccm or lower (by setting the $H_2$ gas partial pressure to 3.03 Torr (404 Pa) or lower).

Thus, by lowering the substrate temperature or reducing the $H_2$ gas flow rate (reducing the $H_2$ gas partial pressure), the chlorine concentration in the film increases and the tensile stress of the film can be reduced. In particular, by setting the substrate temperature to 380° C. or lower, or by setting the $H_2$ gas flow rate to 500 sccm or lower ($H_2$ gas partial pressure to 1.95 Torr (259 Pa) or lower), the tensile stress of the film can be set to 500 MPa or less, or the film stress can become a compressive stress.

As described above, a chlorine-containing tungsten film with a high chlorine concentration may be formed from the beginning of the pre-coating, but the chlorine-containing tungsten film with a high chlorine concentration may be difficult to deposit on the surface of the in-chamber component during the pre-coating. In that case, as shown in FIGS. 7A and 7B described above, the initial tungsten film 232 with a low chlorine concentration and a tensile stress is deposited on the surface of the in-chamber component under normal conditions so that a chlorine-containing tungsten film with a high chlorine concentration can be deposited. Then, the chlorine-containing tungsten film 233 is deposited on the initial tungsten film 232. The film thickness of the initial tungsten film 232 is preferably 0.5 nm or more, more preferably in the range of 1 to 15 nm.

Thus, when the chlorine-containing tungsten film 233 is laminated on the initial tungsten film 232 with a tensile stress deposited under normal conditions, since the chlorine-containing tungsten film 233 has a low tensile stress, the stress of the entire tungsten film deposited on the in-chamber component can be relieved. Further, when the chlorine-containing tungsten film 233 has a compressive stress, the stress of the initial tungsten film 232 with a tensile stress can be relieved or offset.

The stress adjustment by the chlorine concentration in the tungsten film deposited on the in-chamber component may be performed only during the pre-coating, or may be performed during both the pre-coating and the actual film formation. When the conditions for the actual film formation are adjusted so that the chlorine concentration in the tungsten film becomes high, a tungsten film with a high chlorine concentration is also formed on the surface of the wafer W, which is the substrate, so that warping of the wafer W due to the tensile stress of the tungsten film can be reduced. Since it is difficult to form a chlorine-containing tungsten film with a high chlorine concentration on the wafer W during the actual film formation as well, it is preferable to first form an initial tungsten film under normal conditions and then form a chlorine-containing tungsten film thereon.

Experimental Example

Next, an experimental example will be described.

Figure 9:
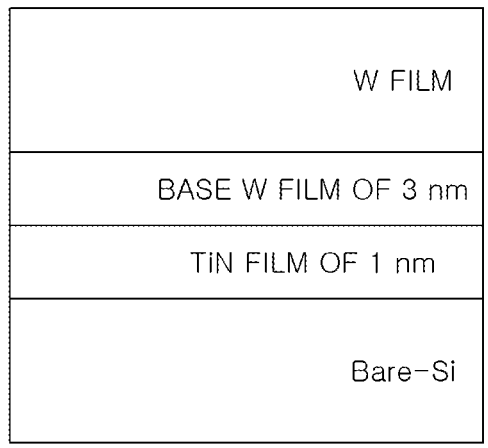
FIG. 9 is a diagram showing a structure of a sample used in an experimental example.
Figure 10A:
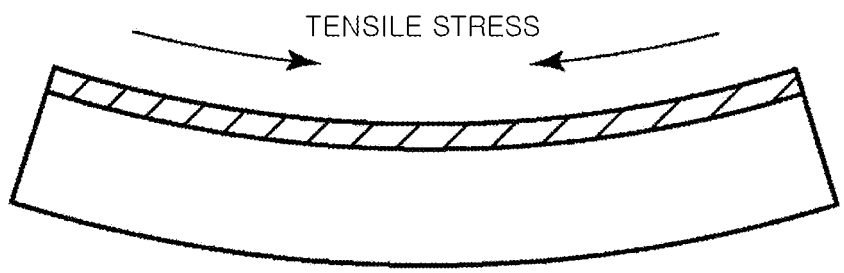
FIGS. 10A and 10B are diagrams for explaining a tensile stress and a compressive stress of a film.
Figure 10B:
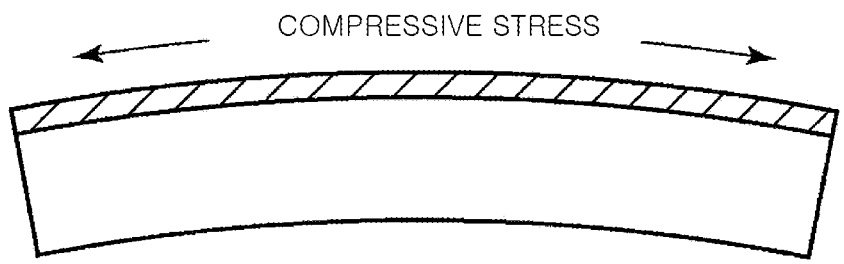

Here, as shown in FIG. 9, a substrate was prepared by forming a TiN film with a thickness of 1 nm on a base made of bare silicon in order to simulate the stress reduction of the tungsten film deposited on the in-chamber component. Then, using the film forming apparatus of FIG. 8, after forming an initial tungsten film with a film thickness of 3 nm on the TiN film, a main tungsten film was formed thereon under various conditions and film thicknesses to prepare samples, and the film stress was measured. As for the film stress, the tensile stress is the stress shown in FIG. 10A, and the compressive stress is the stress shown in FIG. 10B. An initial tungsten film was formed using the conditions for the initial tungsten film shown above, and a tungsten film with a film thickness of 10 to 130 nm was formed thereon by changing the substrate temperature between 35° and 440° C. and changing the $H_2$ gas flow rate between 500 and 5000 sccm. The $H_2$ gas flow rate of 500 to 5000 sccm is 1.95 to 14.00 Torr (259 to 1867 Pa) when converted to the $H_2$ gas partial pressure.

Figure 11:
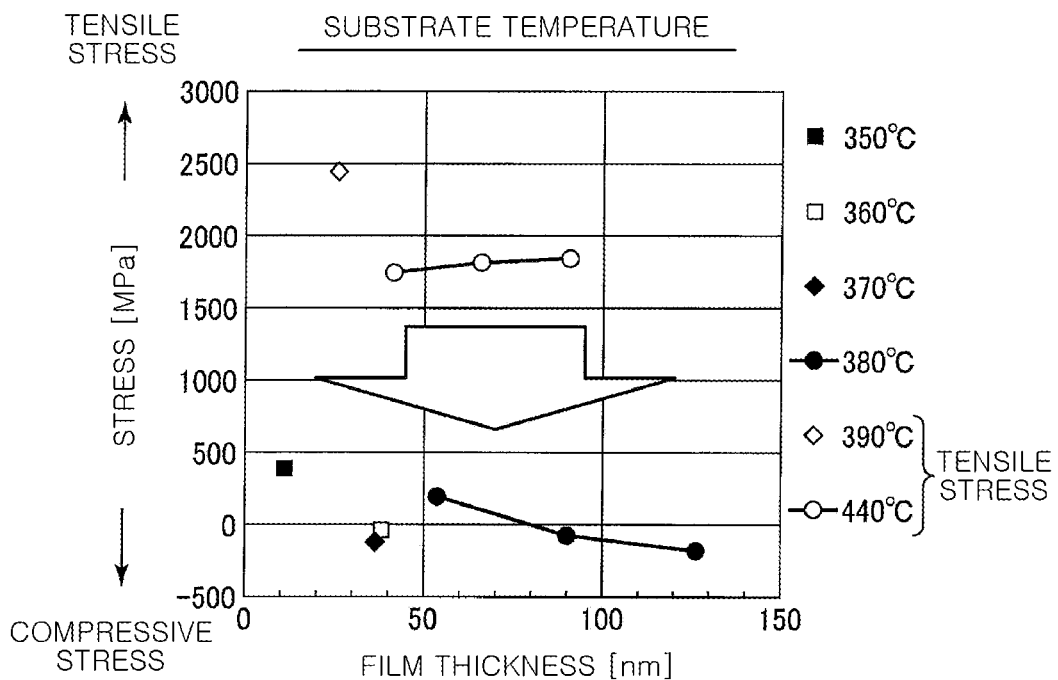
FIG. 11 is a diagram showing a relationship between a film thickness and a film stress in the case of changing a substrate temperature in the experimental example.

FIG. 11 is a diagram showing the relationship between a film thickness and a film stress when the substrate temperature is changed. As shown in FIG. 11, when the substrate temperature was 440° C., the film thickness was 40 to 90 nm and the film stress was 1700 to 1900 MPa, which was a large tensile stress. On the other hand, when the substrate temperature was 380° C. or less, the film thickness was 10 to 130 nm and the tensile stress was relieved to 500 MPa or less, and it was confirmed that as the film thickness increases, the stress changes to a compressive stress.

Figure 12:
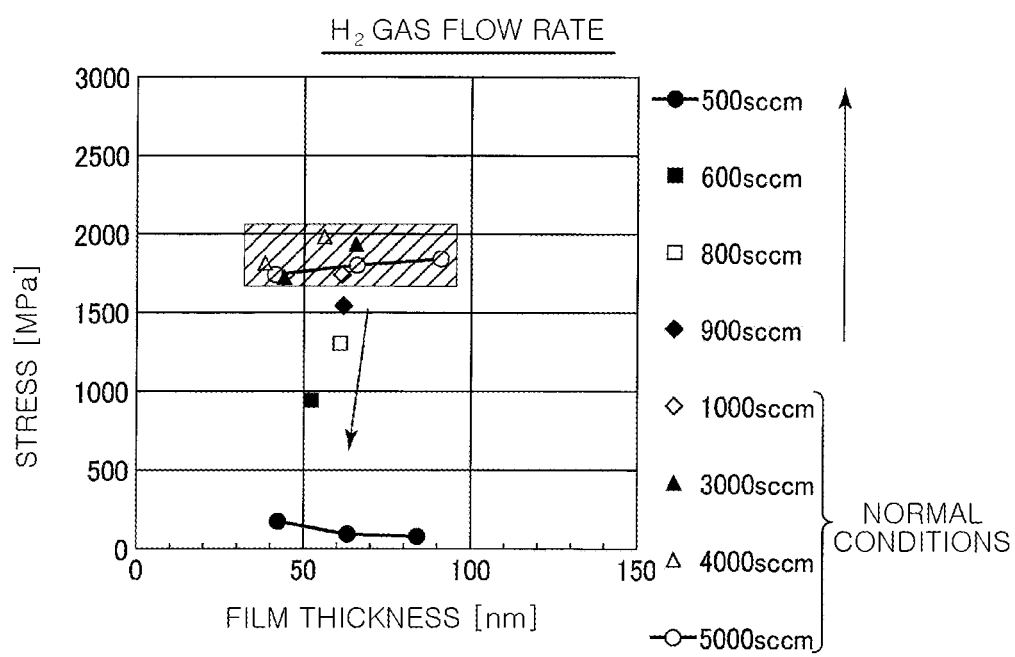
FIG. 12 is a diagram showing a relationship between a film thickness and a film stress in the case of changing an H2 gas flow rate (H2 gas partial pressure)

FIG. 12 is a diagram showing the relationship between a film thickness and a film stress when $H_2$ gas flow rate ($H_2$ gas partial pressure) is changed. As shown in FIG. 12, when the $H_2$ gas flow rate was 900 to 5000 sccm ($H_2$ gas partial pressure was 3.38 to 14.00 Torr (451 to 1867 Pa)), the film thickness was 40 to 90 nm, and the film stress was 1500 to 2000 Pa, which was a large tensile stress. On the other hand, it was confirmed that when the $H_2$ gas flow rate was 800 sccm ($H_2$ gas partial pressure was 3.03 Torr (404 Pa)), the tensile stress was relieved to 1300 MPa, and when the $H_2$ gas flow rate was 500 sccm ($H_2$ gas partial pressure was 1.95 Torr (259 Pa)), the tensile stress was relieved to 500 MPa or less.

Figure 13:
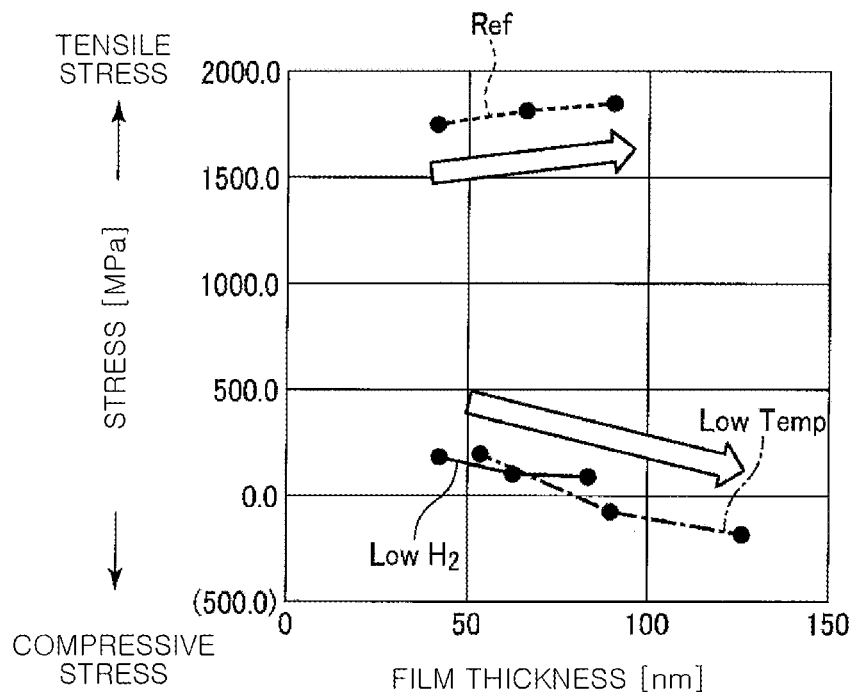
FIG. 13 is a diagram showing a relationship between a film thickness and a film stress in the case of forming tungsten films under Low Temp, Low H2, and normal conditions (Ref) in the experimental example.

Next, the substrate temperature of 380° C. (Low Temp) and the $H_2$ gas flow rate of 500 sccm (Low $H_2$) at which the film stress was small were further studied. FIG. 13 is a diagram showing the relationship between a film thickness and a film stress when tungsten films are formed under Low Temp, Low $H_2$, and normal conditions (Ref). As shown in FIG. 13, similar to the results of FIGS. 11 and 12, a large tensile stress of 1700 to 1900 MPa was obtained under Ref, whereas a tensile stress of 500 MPa or less, or an almost compressive stress in a region where the film thickness was thick, was obtained under Low Temp and Low $H_2$.

Figure 14A:
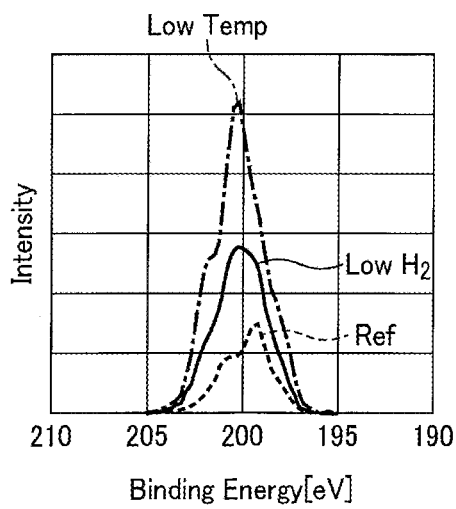
FIGS. 14A and 14B are diagrams showing results of measuring chlorine (Cl) concentrations of the films by X-ray photoelectron spectroscopy (XPS) for the tungsten films formed under Low Temp, Low H2, and Ref in the experimental example.
Figure 14B:
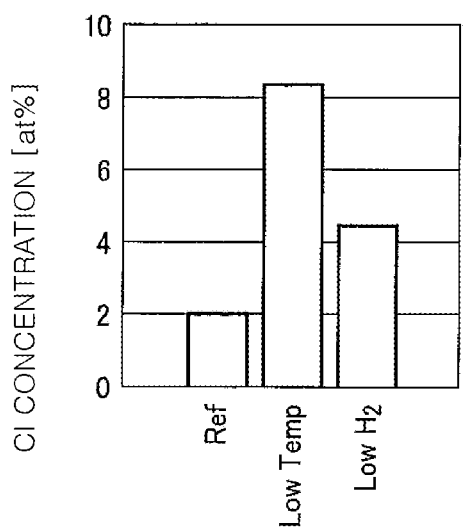

Chlorine (Cl) concentrations in the tungsten films formed under Low Temp, Low $H_2$, and Ref were measured by X-ray photoelectron spectroscopy (XPS). FIG. 14A is a diagram showing the XPS spectrum, and FIG. 14B is a diagram showing the chlorine concentration obtained from the XPS spectrum. As shown in these figures, it was confirmed that the tungsten films formed under Low Temp and Low $H_2$ whose film stresses are low have higher chlorine concentrations than that of the tungsten film formed under Ref, and the chlorine concentrations are 4 at % or more. In other words, it was confirmed that the decrease in the tensile stress corresponds to the increase in the chlorine concentration in the film, and that this tendency becomes significant when the chlorine concentration is 4 at % or more.

Figure 15A:
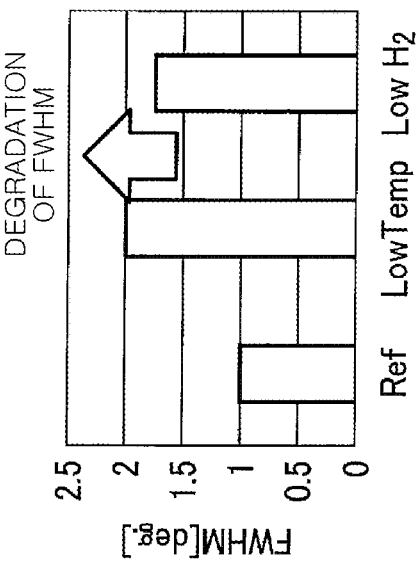
FIGS. 15A to 15C are diagrams showing results of X-ray diffraction (XRD) performed on the tungsten films formed under Low Temp, Low H2, and Ref in the experimental example.
Figure 15B:
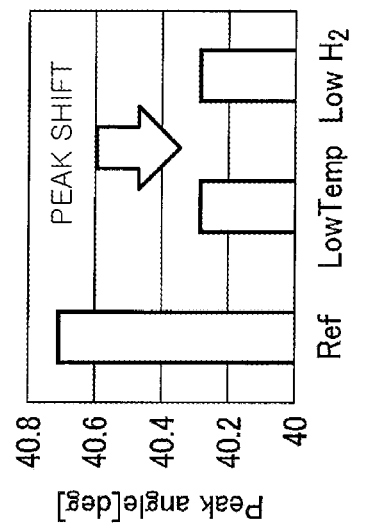
Figure 15C:
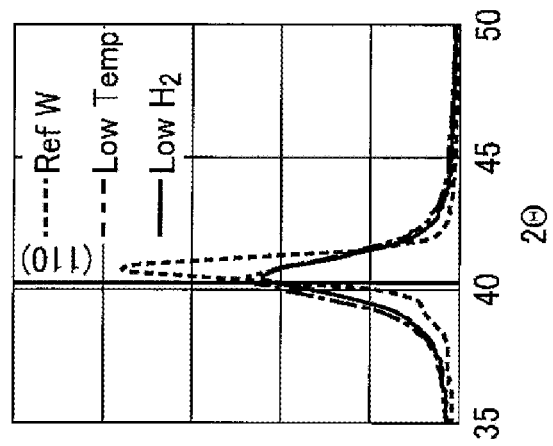

Next, X-ray diffraction (XRD) was performed on the tungsten films formed under Low Temp, Low $H_2$, and Ref. As a result, the diffraction intensities near the (110) plane were as shown in FIG. 15A. FIG. 15B shows the angle of the diffraction peak of the tungsten film on the (110) plane, and FIG. 15C shows the full width at half maximum (FWHM) of the diffraction peak of the tungsten film on the (110) plane. As shown in these figures, it can be seen that the diffraction peaks of the tungsten films formed under Low Temp and Low $H_2$ whose film stresses are low are shifted from the diffraction peak of the tungsten film formed under Ref, the peaks are broadened, and the FWHM is degraded. From this, it was confirmed that the size and arrangement of the crystal lattices of the tungsten films formed under Low Temp and Low $H_2$ are changed as the Cl concentration increases, and the stress is changed due to the mechanism of the model shown in FIGS. 5 and 6 described above.

Other Applications

Although the embodiments have been described above, the embodiments disclosed this time should be considered as examples and not restrictive in all respects. The above-described embodiments may be omitted, replaced, or modified in various ways without departing from the scope and spirit of the appended claims.

For example, in the above embodiments, the case of forming a tungsten film using tungsten chloride and a reducing gas has been described, but the present disclosure is not limited thereto.

Further, in the above embodiments, the semiconductor wafer is used as an example of the substrate, but the substrate is not limited to the semiconductor wafer, and other substrate such as a glass substrate and a ceramic substrate may be used.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

The invention claimed is:

1. A stress reducing method comprising:
preparing a film forming apparatus configured to form a tungsten film on a substrate in a chamber by supplying a tungsten raw material gas and a reducing gas into the chamber; and
making at least a part of a tungsten film deposited on an in-chamber component into a chlorine-containing tungsten film whose film stress is reduced by adjusting a chlorine concentration, when performing pre-coating in the chamber and/or when forming the tungsten film on the substrate, using the tungsten raw material gas and the reducing gas,
wherein the chlorine-containing tungsten film has a chlorine concentration of 4 at % or more.

2. The stress reducing method of claim 1, wherein when performing the pre-coating and when forming the tungsten film on the substrate, an initial tungsten film with a chlorine concentration lower than that of the chlorine-containing tungsten film is deposited on a surface of the in-chamber component, and the chlorine-containing tungsten film is deposited thereon.

3. The stress reducing method of claim 1, wherein the chlorine-containing tungsten film has a tensile stress of 500 MPa or less or a compressive stress.

4. The stress reducing method of claim 1, wherein when performing the pre-coating and when forming the tungsten film on the substrate, tungsten chloride is used as the tungsten raw material gas and $H_2$ gas is used as the reducing gas.

5. The stress reducing method of claim 4, wherein when depositing the chlorine-containing tungsten film, a partial pressure of $H_2$ gas is set to 404 Pa or less.

6. The stress reducing method of claim 5, wherein when forming the chlorine-containing tungsten film, the partial pressure of $H_2$ gas is set to 259 Pa or less and/or a substrate temperature is set to 380° C. or less.

7. The stress reducing method of claim 6, wherein the chlorine-containing tungsten film has a tensile stress of 500 MPa or less or a compressive stress.

8. The stress reducing method of claim 1, wherein the in-chamber component includes a substrate stage on which a substrate is placed, a shower head configured to supply a gas into the chamber, and walls of the chamber.

* * * * *